United States Patent [19]

Smith

[11] 4,044,309

[45] Aug. 23, 1977

[54] AUTOMATIC SQUELCH CIRCUIT WITH HYSTERESIS

[75] Inventor: John F. Smith, Warminster, Pa.

[73] Assignee: Narco Scientific Industries, Inc., Fort Washington, Pa.

[21] Appl. No.: 656,259

[22] Filed: Feb. 9, 1976

Related U.S. Application Data

[63] Continuation of Ser. No. 489,597, July 18, 1974, abandoned.

[51] Int. Cl.² .............................................. H04B 1/10
[52] U.S. Cl. .................................................. 325/478
[58] Field of Search ............... 325/348, 478, 402, 403, 325/474, 319, 473, 475, 476

[56] References Cited

U.S. PATENT DOCUMENTS

| | | | |
|---|---|---|---|
| 3,325,738 | 6/1967 | Busby et al. | 325/478 |
| 3,350,650 | 10/1967 | Kemper | 325/478 |
| 3,538,253 | 11/1970 | Braun | 325/478 |
| 3,873,926 | 3/1975 | Wright | 325/478 |
| 3,894,285 | 7/1975 | Schaeperkoetter | 325/478 |

Primary Examiner—Robert L. Griffin
Assistant Examiner—Marc E. Bookbinder

[57] ABSTRACT

A radio receiver squelch circuit operative as a function of a comparison of the audio component level of the detected signal with the noise component level, so as to amplify and pass signals when the audio component exceeds the noise component by a predetermined ratio and to shunt the signals, thus squelching any output, when the noise component exceeds the audio component by a predetermined ratio. The circuit incorporates a hysteresis function such that the audio level required to initiate squelch is less than that required to break squelch.

2 Claims, 5 Drawing Figures

AUTOMATIC SQUELCH CIRCUIT WITH HYSTERESIS

BACKGROUND OF THE INVENTION

1. Field of the Invention

This invention lies in the field of squelch circuits and, more particularly, radio receiver squelch circuits wherein the audio signal is used as the activating signal source.

2. Description of the Prior Art

In conventional squelch circuits, the carrier signal is used as a signal for determining when the squelch circuit is turned on or off, thus opening or closing transmission of the detected signal through the receiver to the output. In a typical prior art squelch circuit, when the AGC voltage exceeds a predetermined level set by a front panel squelch control, a squelch gate such as a transistor saturates, shunting the signal such that there is no circuit output. However, prior art devices using a carrier to noise type squelch inherently contain certain problems and, in particular, have a limitation in the lowest level of signal to noise at which the circuit may be set for squelch.

Specifically, in circuits using a carrier to noise squelch, there is a problem regarding transmission of the audio to the output with very low signal to noise ratios. In fact, intelligible audio signals can be heard with a 3 db signal plus noise to noise ratio. However, since the AGC voltage necessarily changes as the receiver gain changes, and the gain is a function of temperature, the AGC voltage is susceptible to change with temperature variations. Accordingly, circuitry using the AGC voltage to operate this squelch requires a great deal of sophisticated temperature compensation circuitry, and substantial additional gain, in order to operate the squelch at very low signal to noise levels. Although theoretically squelching can be done at desired low signal level when utilizing the AGC, this imposes substantial additional expense to ensure the required accuracy and reliability. There thus remains a great need in this field for a reliable, simple and inexpensive circuit design which will permit squelching operation at lower signal to noise levels, and which will be less sensitive to temperature variations.

SUMMARY OF THE INVENTION

It is an object of this invention to provide a squelch circuit which is activated by the detected audio signal, and provides for automatic squelching operation at a lower signal to noise level than prior art squelch circuits of comparable expense.

It is another object of this invention to provide an automatic audio-type squelch circuit having a desirable hysteresis characteristic.

It is a further object of this invention to provide an automatic squelch circuit providing a squelch breakpoint at a signal level lower than that reliably available in prior art devices, and which is of simple and economical design, is relatively temperature insensitive, and provides reliable squelching operation.

In accordance with the above objectives, there is provided a squelch circuit adapted for incorporation in a radio receiver having a first channel for providing a signal representative of the audio component of the detected audio signal, a second channel for providing a signal representative of the noise component of the detected audio signal, and a squelch circuit including a comparator which develops a signal representative of the relative level of the representative audio and noise signals and which provides squelching as a function of such relative levels. The squelch gate, which is operated by the comparator, presents a relatively low impedance in the transmission path through the squelch circuit during squelch, and a relatively high impedance when not squelching, thus providing a desired hysteresis function.

DESCRIPTION OF THE PREFERRED EMBODIMENT

Figure 1:
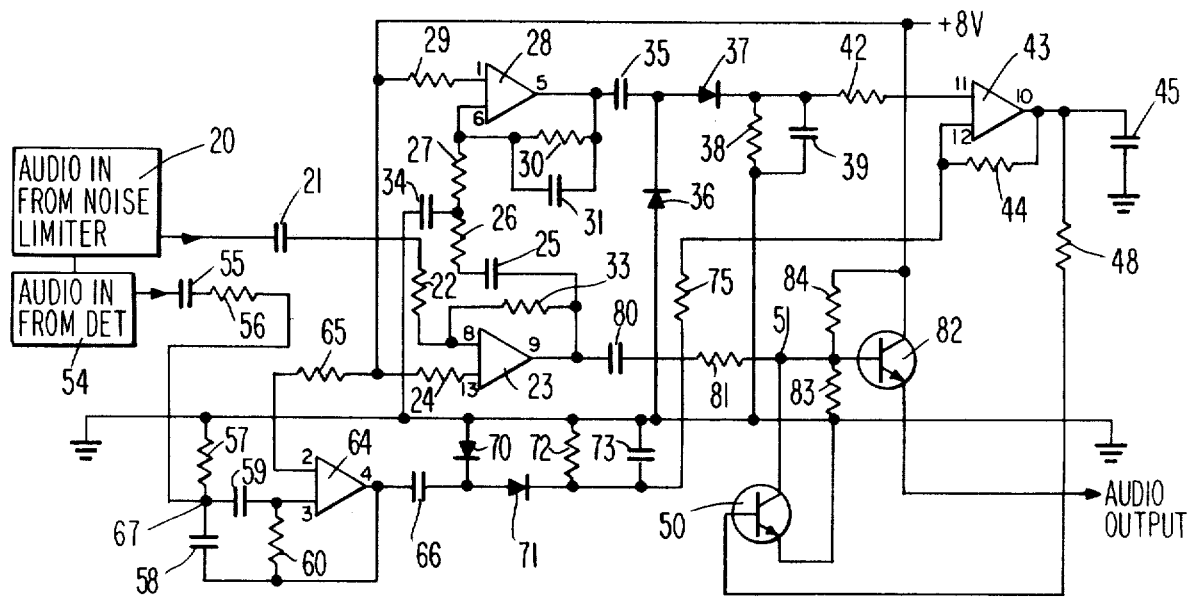
FIG. 1 is a circuit diagram showing the automatic squelch amplifier apparatus of this invention.

Referring now to FIG. 1, there are shown two inputs to the circuit of this invention, namely the audio input from a noise limiter, designated 20, and the audio input from the detector, designated 54. Block 54 represents a typical radio receiver up to and including the output of the detector. Block 20 represents the same receiver portion as block 54 with the addition of a noise limiter circuit, which noise limiter processes the output from the detector so as to limit the noise which is permitted to pass. The components of both blocks 20 and 54 are well known in the prior art, and the details of such need not be included herein for an understanding of this invention. While not essential to the circuit of the present invention, the noise limiter may preferably correspond to that disclosed in applicant's co-pending application entitled Improved Noise Limiter, Ser. No. 486,968, filed July 10, 1074, now U.S. Pat. No. 3,968,383 granted July 6, 1976.

The audio signal 20 is passed through a capacitor 21 and resistor 22 to input terminal 8 of a linear amplifier 23. Conveniently, elements 23, 28, 43 and 64 may all be one-quarter of IC chip type MC3401P, as manufactured by Motorola. Input terminal 13 is connected through resistor 24 to a positive voltage source. The output of terminal 23 is connected through feedback resistor 33 to input terminal 8, and also is connected through capacitor 25, resistor 26 and resistor 27 to input terminal 6 of active element 28. At the node between resistor 26 and 27, capacitor 34 is connected through to ground. Capacitors 25 and 34 in combination with resistor 26 provide a high frequency roll-off circuit. Resistor 30 in parallel with capacitor 31 is connected as a feedback between the output terminal 5 and input terminal 6 of element 28. The elements together with amplifier element 28 comprise an active filter nominally passing frequencies within the range of 200 Hz to 3 kHz.

The output of amplifier 28 is coupled through capacitor 35 to the cathode of diode 36 and the anode of diode 37. These diodes operate in combination with the filter (comprising resistor 38 in parallel with capacitor 39 connected between the cathode of diode 37 and ground) to provide peak detection. The peak detected signal is coupled through resistor 42 to input terminal 11 of comparator 43. Comparator 43 has a feedback resistor 44 tied between terminal 10 and input terminal 12, the latter input terminal being connected to the output of the noise channel as described hereinbelow. The output of comparator 43 is connected through capacitor 45 to ground, and through resistor 48 to the base of transistor 50. Transistor 50, which is the squelch gate, has its emitter connected directly to ground, and its collector is connected to node 51. When the output of comparator 43 is high, transistor 50 is driven to saturation and thus provides a shunt from node 51 to ground. When the output of comparator 43 is low, transistor 50 remains off, and does not affect the remainder of the circuit.

Still referring to FIG. 1, attention is now directed to the noise channel. The audio with noise, from block 54, is coupled through capacitor 55 and resistor 56 to node 67, which in turn is connected to ground through resistor 57. From node 67, a signal is coupled through capacitor 59 to terminal 3 of active element 64. The output terminal 4 of element 64 is connected through resistor 60 to input terminal 3, and through capacitor 58 to node 67. Input terminal 2 of element 64 is connected through resistor 65 to the positive voltage supply. Amplifier element 64, combined with the RC feedback path provides an active filter passing frequencies approximately between 4 kHz and 15 kHz.

The output of element 64 is coupled through capacitor 66 to the cathode of diode 70 which has its anode connected to ground, as well as to the anode of diode 71. These diodes, as in the audio path, comprise a peak detector, the output of which is filtered by resistor 72 and capacitor 73 tied between the cathode of diode 71 and ground. The filtered peak voltage is connected through resistor 75 to input terminal 12 of comparator 43. Thus, the two input signals to comparator 43 are obtained through the audio path (amplifiers 23 and 28) and the noise channel (amplifier 64) respectively.

The output of audio channel amplifier 23 is also coupled through capacitor 80 and resistor 81 to node 51, which as stated hereinbefore is connected to squelch gate 50. Node 51 is also connected to the base of output amplifier 82. The collector of amplifier 82 is connected directly to the positive voltage supply, and the base is biased through the divider comprising resistors 83 and 84. The output of transistor 82 is taken at the emitter, and comprises the audio output of the squelch circuit.

In operation, the audio signal from block 20 is processed through an audio channel comprising amplifier element 28 to produce a signal representative of the audio component which emerges from the receiver detector. The signal from the detector, as provided from block 54, is processed through a noise channel comprising amplifier element 64 to produce a signal representative of the noise component from the detector. These two signals are compared at comparator 43, producing a signal which is high or low depending upon which representative signal is greater. Thus, when the audio signal from the audio channel is greater than the noise signal from the noise channel, the comparator output is low and squelch gate 50 remains open and thus has no effect on transmission of the audio signal from amplifier element 23 through to output amplifier 82. When the noise signal is greater than the audio signal, the output of comparator 43 goes high, thus saturating transistor gate 50 and shunting the audio signal to ground.

Figure 2:
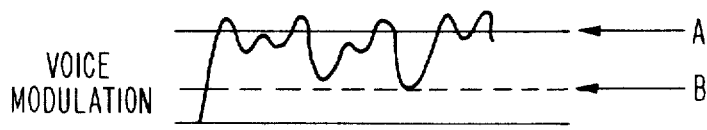
FIG. 2 is a graph illustrating the hysteresis levels of the apparatus of this invention.

Referring to FIG. 2, there is shown a curve of a typical voice modulation signal, representative of the audio signal, with two signal levels designated A and B. In the squelch circuit of this invention, the audio signal must reach a relatively high level as indicated at A in order to break squelch, and permit transmission of the signal. However, once the squelch is broken, the signal must drop all the way down to the B level before squelch is again initiated. This is achieved due to the effect of transistor 50 on the output impedance as seen by amplifier element 23. When the unit is squelched (no audio out), transistor 50 is turned on and the impedance at the output of element 23 is approximately 560 ohms (for the circuit using the values as set forth in Table I hereinbelow). When the squelch breaks, transistor 50 is turned off and the impedance at output terminal 9 of element 23 is approximately 4 k ohms. Accordingly, it takes a larger audio input signal to develop the same output voltage at the amplifier 23 output when the unit is squelched than when the unit is not squelched. Stating it another way, when not squelched, the unit requires a smaller input signal than that required to break squelch before the squelch turns back on. This hysteresis function prevents the squelch from breaking in and out with a variation in modulation.

Figure 5:
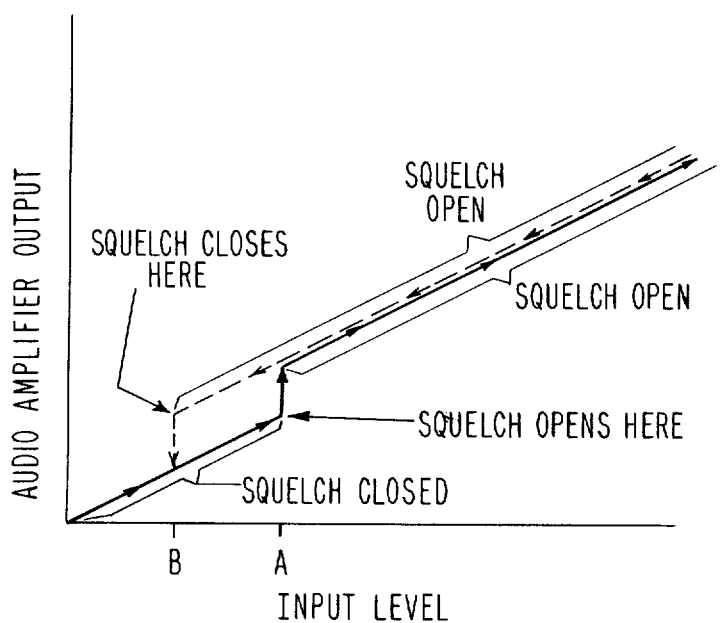
FIG. 5 is a graphical representation of the hysteresis feature of the circuit of the present invention.

The graphical representation in FIG. 5 brings out the manner in which the audio output varies with variations in input signal to the audio amplifier 23. The solid-line curve shows that, at low level of input to audio amplifier 23, the squelch gate is closed. As the audio amplifier input level increases, the audio output increases until at point A the squelch gate opens.

In terms of the circuit of FIG. 1, the squelch gate 50 is closed when the output from comparator 43 is positive. This is the condition when the noise signal of lead 12 is predominant. This positive output signal from comparator 43 is applied to the input electrode of transistor 50 and transistor 50 conducts. This places a low impedance across input resistor 83. Accordingly, the output impedance of audio amplifier 23 is low.

Referring again to FIG. 5, when the level of the audio amplifier input signal reaches point A, the output from comparator 43 goes negative and transistor 50 is cut-off. The input impedance of the audio output transistor 82 now becomes high, and so does the output impedance of audio amplifier 23. This results in a sudden increase in audio output. This is indicated by the vertical rise in the solid-line curve of FIG. 5 at point A. Thereafter, the audio output increases as the input level increases.

When the audio amplifier input signal decreases (the decreasing signal is indicated by the dashed line curve in FIG. 5), the squelch gate does not close at point A due to the fact that transistor 50 is not conducting and the output impedance seen by audio amplifier 23 is high. The squelch gate remains open, when the signal is decreasing, until point B is reached. In terms of the circuit of FIG. 1, it is not until point B is reached that gate transistor 50 starts conducting. When this happens, the output impedance of audio amplifier 23 suddenly goes low, as does the input impedance of audio output transistor 82. As a result, there is a sudden drop in the audio output signal, as indicated by the vertical fall in the dashedline at point B, in FIG. 5.

It will be seen that the parallelogram in FIG. 5 is similar to the hysteresis curve of a magnetic material having remanent properties. Accordingly, the mode of operation of the present application is identified as a "hysteresis" method of operation and series resistor 81 is identified as the hysteresis resistor since its impedance, relative to the input impedance of audio output transistor 82, determines the size of the hysteresis parallelogram. If the value of series resistor 81 is increased, the difference in impedance between the two conditions, (squelch gate open vs. squelch gate closed) is decreased and the size of the hysteresis parallelogram is not as large. Stated another way, the hysteresis would not be as great.

The circuit of this invention has been found to operate highly efficiently when designed with the component values as set forth in Table I hereinbelow. These component values are given for illustrative purposes only, it being understood that design variations may be made as a matter of expediency and remain within the scope of this invention.

TABLE I

| Component Designation | Component Type And Value |
|---|---|
| 21 | C - .05 mf |
| 22 | R - 220K |
| 23 | ¼ IC MC3401P |
| 24 | R - 1.2M |
| 25 | C - .005 mf |
| 26 | R - 33 K |
| 27 | R - 6.8 K |
| 28 | ¼ IC MC3401P |
| 29 | R - 1M |
| 30 | R - 470K |
| 31 | C - 100 pf |
| 33 | R - 560K |
| 34 | C - .022 mf |
| 35 | C - 1.0 mf |
| 36 | Diode |
| 37 | Diode |
| 38 | R - 1M |
| 39 | C - 1.0 mf |
| 42 | R - 150K |
| 43 | ¼ IC MC3401P |
| 44 | R - 1.2M |
| 45 | C - 3.3 mf |
| 48 | R - 56K |
| 50 | Transistor - 2N3391 |
| 55 | C - .05 mf |
| 56 | R - 6.8K |
| 57 | R - 2.2K |
| 58 | C - 510 pf |
| 59 | C - 510 pf |
| 60 | R - 560K |
| 64 | ¼ IC MC3401P |
| 66 | C - .05 mf |
| 70 | Diode |
| 71 | Diode |
| 72 | R - 1M |
| 73 | C - .47 mf |
| 75 | R - 150K |
| 80 | C - 1.0 mf |
| 81 | R - 560 |
| 82 | Transistor - 2N3391 |
| 83 | R - 6.8K |
| 84 | R - 6.8K |

Figure 3:
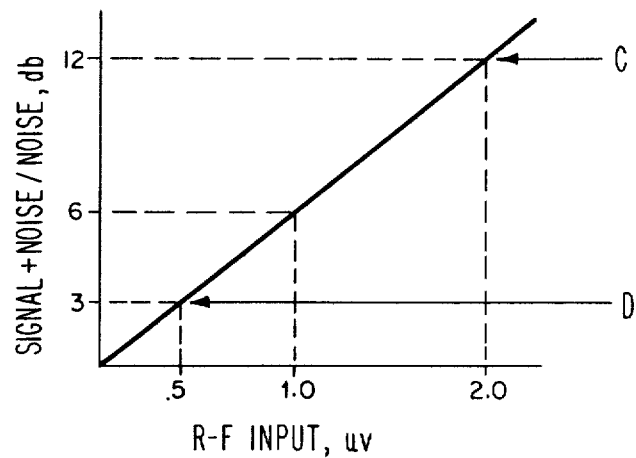
FIG. 3 is a graph illustrating the signal levels at which prior art devices and the apparatus of this invention can provide the squelch breakpoint.
Figure 4:
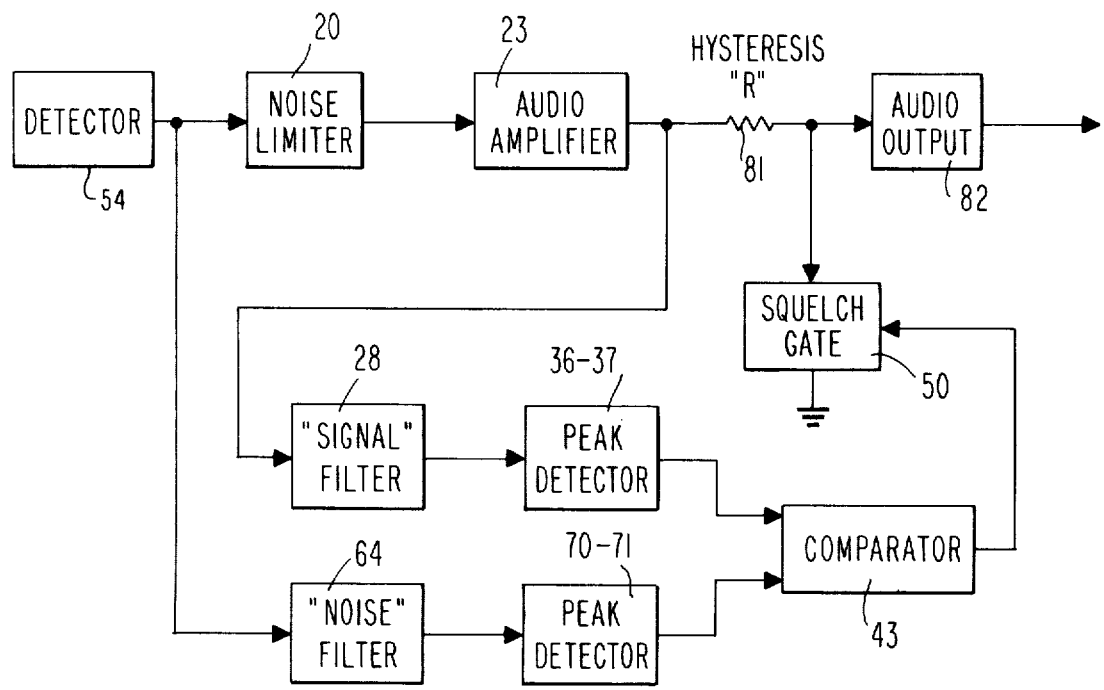
FIG. 4 is a block diagram of the circuit of FIG. 1.

Referring to FIG. 3, there is shown a graph illustrating the improvement in performance of the circuit of this invention as compared to prior art carrier-type squelch circuits. In most carrier-type squelch circuits which are activated by the AGC voltage, the squelch circuit is set to break in when the signal plus noise/noise ration drops to 12 db corresponding roughly to an RF input of 2.0 uv, as indicated by arrow C. As most receivers start to develop an AGC voltage with a 6 db signal plus noise/noise ration, prior art circuits could conceivably break at such level, corresponding to an approximate RF input of 1 uv. However, such operation would not be reliable since the AGC voltage changes as a function of gain and it is consequently sensitive to temperature variations. By contrast, by using the audio signal as a means to break the squelch, the breakpoint can be set to a much lower signal to noise ratio without the problems attendant to the carrier-type squelch circuit. In operation of this circuit, the breakpoint is set at a signal plus noise/noise ratio of approximately 3 db, corresponding to an RF input of about 0.5 uv, as indicated by arrow D. The improvement is made possible largely by the fact that the squelch-activating signal is relatively independent of receiver gain and insensitive to temperature variations. By developing the comparison between a signal representative of the audio component and a signal representative of the noise component from the detector, as is done by the two channels of FIG. 1, the comparison which activates the squelch gate can be made reliably at the 3 db signal plus noise/noise level, which corresponds to about the low limit where the audio information can be distinguished from the noise.

It is understood that while FIG. 1 represents the preferred embodiment of applicant's invention, design changes can be made within the broad scope of the claimed invention. Thus, other ways of processing the audio signal to provide audio-activated squelch may be adopted.

I claim:

1. In a squelch circuit for a radio receiver having an audio detector and an audio output amplifier,
   a. means, including a noise limiter and an audio amplifier in series, for applying the output of said audio detector to the input of said audio output amplifier;
   b. said audio amplifier having an output circuit which includes a voltage divider comprising a series resistor and a shunt resistor, the resistance of said series being low relative to the resistance of the shunt resistor;
   c. an electronic squelch gate having conductive and nonconductive states, said squelch gate having an output circuit connected in parallel with said shunt resistor of said audio amplifier;
   d. a comparator having first and second input circuits for receiving audio and noise signals, respectively;
   e. means coupling the noise-limited audio output of said audio amplifier to said first input circuit of said comparator;
   f. means, including a noise filter for passing noise signals above the audio range, coupling said audio detector to said second input circuit of said comparator;
   g. means coupling the output of said comparator across the input of said squelch gate;
   h. said comparator, in response to predominantly noise signals, developing and applying to said squelch gate a signal of a polarity to cause said squelch gate to be conductive, whereby the impedance of its output circuit becomes low and effectively shorts out said shunt resistor in the output circuit of said audio amplifier;
   i. said comparator, in response to predominately noiselimited audio signals, applying to said squelch gate a signal of a polarity to cause said gate to be nonconductive, whereby the impedance of its output circuit becomes high and maintains the effectiveness of said shunt resistor in the output circuit of said audio amplifier; non-conductive,
   j. whereby once the squelch gate becomes non-conductive the amplitude required of a decreasing audio input signal to maintain said squelch gate non-conductive is substantially less than the amplitude required of an increasing audio input signal to turn off a conducting squelch gate, whereby said squelch circuit exhibits a hysteresis character.

2. A squelch circuit according to claim 1 wherein the resistance of said shunt resistor of output circuit of said audio amplifier is at least ten times as great as the resistance of said series resistor.

* * * * *